(12) United States Patent
Sakai et al.

(10) Patent No.: US 8,277,560 B2
(45) Date of Patent: Oct. 2, 2012

(54) CVD APPARATUS AND METHOD OF CLEANING THE CVD APPARATUS

(75) Inventors: Katsuo Sakai, Tokyo (JP); Seiji Okura, Tokyo (JP); Masaji Sakamura, Tokyo (JP); Kaoru Abe, Tokyo (JP); Hitoshi Murata, Tokyo (JP); Etsuo Wani, Tokyo (JP); Kenji Kameda, Tokyo (JP); Yuki Mitsui, Tokyo (JP); Yutaka Ohira, Tokyo (JP); Taisuke Yonemura, Tokyo (JP); Akira Sekiya, Ibaraki (JP)

(73) Assignees: National Institute of Advanced Industrial Science and Technology, Tokyo (JP); Canon Anelva Corporation, Kawasaki-shi (JP); Ulvac, Inc., Chigasaki-shi (JP); Kanto Denka Kogyo Co., Ltd., Tokyo (JP); Sanyo Electric Co., Ltd., Moriguchi-shi (JP); Showa Denko K.K., Tokyo (JP); Sony Corporation, Tokyo (JP); Tokyo Eectron Limited, Tokyo (JP); Hitachi Kokusai Electric Inc., Tokyo (JP); Panasonic Corporation, Kadoma-shi (JP); Mitsubishi Denki Kabushiki Kaisha, Tokyo (JP); Renesas Electronics Corporation, Kawasaki-shi (JP)

( * ) Notice: Subject to any disclaimer, the term of this patent is extended or adjusted under 35 U.S.C. 154(b) by 971 days.

(21) Appl. No.: 10/492,539

(22) PCT Filed: Mar. 19, 2003

(86) PCT No.: PCT/JP03/03337
§ 371 (c)(1),
(2), (4) Date: Apr. 27, 2004

(87) PCT Pub. No.: WO03/081652
PCT Pub. Date: Oct. 2, 2003

(65) Prior Publication Data
US 2004/0250775 A1    Dec. 16, 2004

(30) Foreign Application Priority Data

Mar. 27, 2002 (JP) .................................. 2002-89048
Jun. 5, 2002 (JP) .................................. 2002-164687

(51) Int. Cl.
*H01L 21/00* (2006.01)
*C23C 16/00* (2006.01)

(52) U.S. Cl. .............. 118/715; 156/345.29; 156/345.33; 156/345.34

(58) Field of Classification Search .................. 118/715; 156/345.33
See application file for complete search history.

(56) References Cited

U.S. PATENT DOCUMENTS 5,567,478 A * 10/1996 Houben et al. ................ 427/342
(Continued)

FOREIGN PATENT DOCUMENTS

EP    1 164 628 A2    12/2001
(Continued)

OTHER PUBLICATIONS

U.S. Appl. No. 10/492,540, filed Apr. 27, 2004, Sakai et al.

Primary Examiner — Ram N. Kackar
(74) Attorney, Agent, or Firm — Oblon, Spivak, McClelland, Maier & Neustadt, L.L.P.

(57) ABSTRACT

A CVD apparatus cleaning method that efficiently removes by-product such as $SiO_2$ or $Si_3N_4$ adhered to and deposited on surfaces of an inner wall, an electrode, and the like in a reaction chamber at a film forming step. In the cleaning method the discharged cleaning gas amount is very small, environmental influences such as global warming can be lessened, and cost can be reduced. A CVD apparatus supplying reactive gas into a reaction chamber and forming a deposited film on a surface of a base material provided in the reaction chamber includes an exhaust gas recycling path recycling an exhaust gas reaching the reaction chamber from downstream of a pump on an exhaust path for exhausting a gas from an inner part of the reaction chamber through the pump.

6 Claims, 4 Drawing Sheets

U.S. PATENT DOCUMENTS

| | | | |
|---|---|---|---|
| 6,223,584 B1 * | 5/2001 | Mustacich et al. | 73/23.41 |
| 6,277,173 B1 * | 8/2001 | Sadakata et al. | 95/12 |
| 2001/0051232 A1 | 12/2001 | Sakai et al. | |
| 2002/0121132 A1 * | 9/2002 | Breed et al. | 73/146 |

FOREIGN PATENT DOCUMENTS

| | | | |
|---|---|---|---|
| JP | 07299321 A | * | 11/1995 |
| JP | 09251981 A | * | 9/1997 |
| JP | 09283419 A | * | 10/1997 |
| JP | 10125657 A | * | 5/1998 |
| JP | 10266961 A | * | 10/1998 |
| JP | 10266962 A | * | 10/1998 |
| JP | 2001358123 A | * | 12/2001 |
| JP | 2002-33315 | | 1/2002 |
| JP | 2003-017416 | | 1/2003 |
| JP | 2003-059916 | | 2/2003 |
| KR | 2000-0004869 | | 1/2000 |

* cited by examiner

CVD APPARATUS AND METHOD OF CLEANING THE CVD APPARATUS

TECHNICAL FIELD

The present invention relates to a chemical vapor deposition (CVD) apparatus for forming a uniform thin film of high quality, for example, silicon oxide ($SiO_2$) or silicon nitride ($Si_3N_4$ or the like) on a surface of a base material for a semiconductor such as a silicon wafer.

In more detail, the present invention relates to a CVD apparatus capable of executing cleaning for removing a by-product adhered to an inner wall of a reaction chamber or the like after a thin film forming process, and a method of cleaning the CVD apparatus using the CVD apparatus.

BACKGROUND ART

Conventionally, a thin film such as silicon oxide ($SiO_2$) or silicon nitride ($Si_3N_4$ or the like) is widely used in a semiconductor element such as a thin film transistor, a photoelectric converting element or the like. The following three kinds of techniques for forming a thin film such as silicon oxide, silicon nitride or the like are mainly used.

(1) Physical vapor-phase film forming technique such as sputtering or vacuum deposition more specifically, a technique for converting a solid thin film material to an atom or an atomic group to be physical means and depositing the same on a surface of a formed film, thereby forming a thin film;

(2) Thermal CVD technique more specifically, a technique for heating a gaseous thin film material to a high temperature so as to induce chemical reaction, thereby forming a thin film; and (3) Plasma CVD technique more specifically, a technique for converting a gaseous thin film material to a plasma so as to induce chemical reaction, thereby forming a thin film.

In particular, the plasma CVD technique (plasma enhanced chemical vapor deposition) in (3) is widely used because a minute and uniform thin film can efficiently be formed.

A plasma CVD apparatus 100 to be used in the plasma CVD technique is generally constituted as shown in FIG. 4.

More specifically, the plasma CVD apparatus 100 comprises a reaction chamber 102 maintained in a decompression state, and an upper electrode 104 and a lower electrode 106 are provided to be opposed apart from each other at a constant interval in the reaction chamber 102. A film forming gas supply path 108 connected to a film forming gas source (not shown) is connected to the upper electrode 104, and a film forming gas is supplied into the reaction chamber 102 through the upper electrode 104.

Moreover, a high frequency applicator 110 for applying a high frequency is connected to the reaction chamber 102 in the vicinity of the upper electrode 104. Furthermore, an exhaust path 114 for exhausting a gas through a pump 112 is connected to the reaction chamber 102.

In the plasma CVD apparatus 100 thus constituted, for example, monosilane ($SiH_4$), $N_2O$, $N_2$, $O_2$ or Ar in the formation of the film of silicon oxide ($SiO_2$) and monosilane ($SiH_4$), $NH_3$, $N_2$, $O_2$ or Ar in the formation of the film of silicon nitride ($Si_3N_4$ or the like) are introduced through the film forming gas supply path 108 and the upper electrode 104 into the reaction chamber 102 maintained in a decompression state of 130 Pa, for example. In this case, a high frequency power of 13.56 MHz is applied between the electrodes 104 and 106 provided opposite to each other in the reaction chamber 102 through the high frequency applicator 110, for example. As a result, a high frequency electric field is generated, electrons are impacted with neutral molecules of a film forming gas in the electric field, and a high frequency plasma is formed so that the film forming gas is dissociated into ions and radicals. By the actions of the ions and radicals, a silicon thin film is formed on a surface of a semiconductor product W such as a silicon wafer which is provided on one of the electrodes (the lower electrode 106).

In such a plasma CVD apparatus 100, at a film forming step, a thin film material such as $SiO_2$ or $Si_3N_4$ is also adhered to and deposited on the surfaces of an inner wall, an electrode and the like in the reaction chamber 102 other than the semiconductor product W to be formed by a discharge in the reactive chamber 102 so that a by-product is obtained. When this by-product grows to have a constant thickness, it is peeled by a dead weight, a stress or the like. At the film forming step, consequently, fine particles to be foreign matters are mixed into the semiconductor product so that contamination is caused. For this reason, a thin film of high quality cannot be manufactured so that the disconnection or short-circuit of a semiconductor circuit is caused. In addition, there is a possibility that a yield or the like might be deteriorated.

For this reason, conventionally, a by-product is removed by using, for example, a cleaning gas obtained by adding a fluorocompound such as $CF_4$, $C_2F_6$ or $COF_2$, and $O_2$ or the like if necessary in order to remove such a by-product at any time after the film forming step is ended in the plasma CVD apparatus 100.

More specifically, in a method of cleaning the conventional plasma CVD apparatus 100 using such a cleaning gas, a cleaning gas containing a fluorocompound such as $CF_4$, $C_2F_6$ or $COF_2$ is accompanied by a gas such as $O_2$ and/or Ar in place of a film forming gas in the film formation and the cleaning gas is introduced into the reaction chamber 102 maintained in a decompression state through the film forming gas supply path 108 and the upper electrode 104 after the film forming step is ended as shown in FIG. 4. In the same manner as the film formation, a high-frequency power is applied between the electrodes 104 and 106 provided opposite to each other in the reaction chamber 102 through the high-frequency applicator 110. As a result, a high frequency electric field is generated, electrons in the electric field are impacted with the neutral molecules of the cleaning gas, and a high frequency plasma is formed so that the cleaning gas is dissociated into ions and radicals. The ions and the radicals react to a by-product such as $SiO_2$ or $Si_3N_4$ which is adhered to and deposited on the surfaces of an inner wall, an electrode and the like in the reaction chamber 102 so that the by-product is gasified as $SiF_4$ and is discharged to the outside of the reaction chamber 102 through the exhaust path 114 together with an exhaust gas by the action of the pump 112.

The fluorocompound such as $CF_4$ or $C_2F_6$ to be used as the cleaning gas is a stable compound having a long life in the atmospheric air, and furthermore, there is a problem in that a gas discharging process is hard to perform after the cleaning and a disposal cost is increased. Moreover, global warming coefficient potential (values for a cumulative period of 100 years) of $CF_4$, $C_2F_6$ and $SF_6$ are 6500, 9200 and 23900 respectively, and they are extremely large. Therefore, an adverse influence thereof on an environment is apprehended.

Moreover, the ratio of a gas discharged to the outside of the reaction chamber 102 through the exhaust path 114 is high, that is, approximately 60% in case of $C_2F_6$, for example, and currently, it has an adverse influence on global warming, and a dissociation efficiency is low and a cleaning capability is also low.

In consideration of such actual circumstances, it is an object of the present invention to provide a CVD apparatus capable of executing cleaning in which a by-product such as $SiO_2$ or $Si_3N_4$ adhered to and deposited on the surfaces of an inner wall, an electrode and the like in a reaction chamber can efficiently be removed at a film forming step, and furthermore, the amount of a cleaning gas to be discharged is very small, the influence on an environment such as global warming is also lessened, a gas utilization efficiency is also high and a cost can also be reduced, and manufacturing a thin film of high quality. Furthermore, the object of the present invention is also to provide a method of cleaning the CVD apparatus using the CVD apparatus.

DISCLOSURE OF THE INVENTION

The present invention has been made in order to solve the problems and to attain the object in the prior art described above, and the present invention provides a CVD apparatus for supplying a reactive gas into a reaction chamber and forming a deposited film on a surface of a base material provided in the reaction chamber, wherein an exhaust gas recycling path for recycling an exhaust gas reaching the reaction chamber is provided on an exhaust path for exhausting a gas from an inner part of the reaction chamber through a pump.

Moreover, the present invention provides a method of cleaning a CVD apparatus in which a reactive gas is supplied into a reaction chamber through a reactive gas supply path and a deposited film is formed on a surface of a base material provided in the reaction chamber and an inner part of the reaction chamber is then cleaned, comprising the step of:

cleaning the inner part of the reaction chamber while recycling an exhaust gas to the reaction chamber through an exhaust gas recycling path which is provided on an exhaust path for exhausting a gas from the inner part of the reaction chamber through a pump.

By such a structure, the inner part of the reaction chamber is cleaned while the exhaust gas is recycled to the reaction chamber through the exhaust gas recycling path. Therefore, a cleaning gas component contained in the exhaust gas can be used again as a cleaning gas in the reaction chamber. Consequently, a gas utilization efficiency can be enhanced.

Accordingly, a by-product such as $SiO_2$ or $Si_3N_4$ adhered to and deposited on the inner part of the reaction chamber can be removed. In film formation, therefore, the mixture of fine particles into a semiconductor product and contamination thereof can be eliminated, a thin film of high quality can be manufactured and a yield or the like can also be enhanced.

Moreover, the cleaning gas component discharged finally to the outside is very lessened. Therefore, the amount of the discharge of the cleaning gas is also very small and an influence on an environment such as global warming can also be lessened.

Furthermore, the present invention is characterized in that the exhaust gas recycling path is constituted to recycle the exhaust gas from a downstream side of a dry pump to the reaction chamber.

By such a structure, a pressure is raised. Therefore, it is possible to provide a filter for removing particles or the like. Consequently, the generation of the particles is eliminated and the clogging of the filter is not caused, and the particles are not recycled into the reaction chamber. Consequently, a cleaning effect can be enhanced.

Moreover, the present invention is characterized in that a polymer film device for absorbing and removing an inactive gas in the exhaust gas is provided on the exhaust gas recycling path.

With such a structure, for example, recycling an inactive gas such as $N_2$ or $O_2$ can be absorbed and removed by the polymer film device. Therefore, it is possible to carry out cleaning by recycling only the cleaning gas component into the reaction chamber. Consequently, a gas utilization efficiency can be enhanced. Moreover, it is possible to recover and recycle the inactive gas thus absorbed and removed.

Furthermore, the present invention is characterized in that a separator for selectively removing an unnecessary exhaust gas component is provided on the exhaust gas recycling path.

By such a structure, an unnecessary exhaust gas component such as $SiF_4$, HF, CO or $CO_2$ is selectively removed by the separator. For example, therefore, it is possible to carry out the cleaning by recycling a cleaning gas component such as $COF_2$, $CF_4$ or $F_2$ or a concentrated gas component into the reaction chamber. Consequently, a gas utilization efficiency can be enhanced.

Moreover, the present invention is characterized in that a compressor for raising a pressure of the exhaust gas and recycling the exhaust gas into the reaction chamber is provided on the exhaust gas recycling path.

By the compressor, thus, the pressure of the exhaust gas, that is, the cleaning gas is raised and the gas is recycled into the reaction chamber. Therefore, a pressure in the reaction chamber can be held to be constant. Consequently, it is possible to maintain a cleaning effect to be constant.

Furthermore, the present invention is characterized in that a control device for detecting a component of the exhaust gas recycled into the reaction chamber and for causing the gas component to be constant is provided on the exhaust gas recycling path.

By such a structure, for example, the concentration of $COF_2$ flowing in the exhaust gas recycling path is monitored by the control device. Consequently, the cleaning gas component in the reaction chamber can be maintained in a constant stationary state. Therefore, it is possible to execute uniform and efficient cleaning.

Moreover, the present invention is characterized in that the exhaust gas recycling path is provided with a pressure releasing device for releasing a pressure when the exhaust gas recycling path has a constant pressure or more.

By such a structure, the pressure is released by the pressure releasing device when the pressure of the exhaust gas recycling path is a constant pressure or more. Therefore, it is possible to prevent a rise in the pressure of the exhaust gas recycling path which causes the breakage and damage of apparatuses such as the piping of the exhaust gas recycling path, the pump, the polymer film device and the separator.

Furthermore, the present invention is characterized in that a switching device for switching the exhaust gas recycling path and a reactive gas supply path is provided, the exhaust gas recycling path is opened if necessary when a cleaning gas is to be introduced into the reaction chamber through a remote plasma generating device to clean an inner part of the reaction chamber, and a switching control is carried out by the switching device to close the exhaust gas recycling path when a deposited film is to be formed on a surface of a base material in the reaction chamber.

Moreover, the present invention is characterized in that a switching device for switching the exhaust gas recycling path and a reactive gas supply path is provided, the exhaust gas recycling path is opened when a cleaning gas is to be introduced into the reaction chamber through a remote plasma generating device to clean an inner part of the reaction chamber, and a switching control is carried out by the switching device to close the exhaust gas recycling path when a deposited film is to be formed on a surface of a base material in the reaction chamber.

By such a structure, the exhaust gas recycling path is opened in the cleaning. Therefore, the inner part of the reaction chamber is cleaned while the exhaust gas is recycled into the reaction chamber through the exhaust gas recycling path. Consequently, it is possible to use the cleaning gas component contained in the exhaust gas as a cleaning gas in the reaction chamber again. Thus, the gas utilization efficiency can be enhanced.

On the other hand, when a deposited film is to be formed on the surface of the base material in the reaction chamber, the exhaust gas recycling path is closed. Consequently, it is possible to hold a film forming gas component to be constant. Thus, it is possible to form a uniform thin film of constant quality on the base material.

Furthermore, the CVD apparatus according to the present invention is characterized in that a cleaning gas supply path from a remote plasma generating device is opened and the exhaust gas recycling path is opened if necessary in an initial stage of the cleaning during the cleaning, and a switching control is carried out by the switching device in order to close the cleaning gas supply path, thereby carrying out the cleaning after the cleaning progresses.

Moreover, the method of cleaning a CVD apparatus according to the present invention is characterized in that the reactive gas supply path is opened and the exhaust gas recycling path is opened if necessary in an initial stage of the cleaning during the cleaning, and the reactive gas supply path is closed to carry out the cleaning after the cleaning progresses.

Furthermore, the method of cleaning a CVD apparatus according to the present invention is characterized in that when a cleaning gas is to be introduced into the reaction chamber through the remote plasma generating device, thereby cleaning an inner part of the reaction chamber, a cleaning gas supply path from a remote plasma generating device is opened and the exhaust gas recycling path is opened if necessary in an initial stage of the cleaning during the cleaning, and the reactive gas supply path is closed to carry out the cleaning after the cleaning progresses.

By such a structure, after the cleaning gas, for example, $C_2F_6$ is caused to flow for a constant time, $COF_2$ is generated. Therefore, the $COF_2$ is recycled through the exhaust gas recycling path and can be thereby used as the cleaning gas. Thus, the utilization efficiency of the cleaning gas can be enhanced and a cost can also be reduced.

Moreover, the present invention is characterized in that after a film forming process for a substrate is carried out by the CVD apparatus, a cleaning gas to be used for removing a by-product adhered into the reaction chamber, is a cleaning gas containing a fluorine gas.

By using the cleaning gas containing the fluorine gas, thus, it is possible to stably generate a plasma and to obtain an excellent cleaning uniformity.

BEST MODE FOR CARRYING OUT THE INVENTION

Embodiments (examples) of the present invention will be described below in more detail with reference to the drawings.

Figure 1:
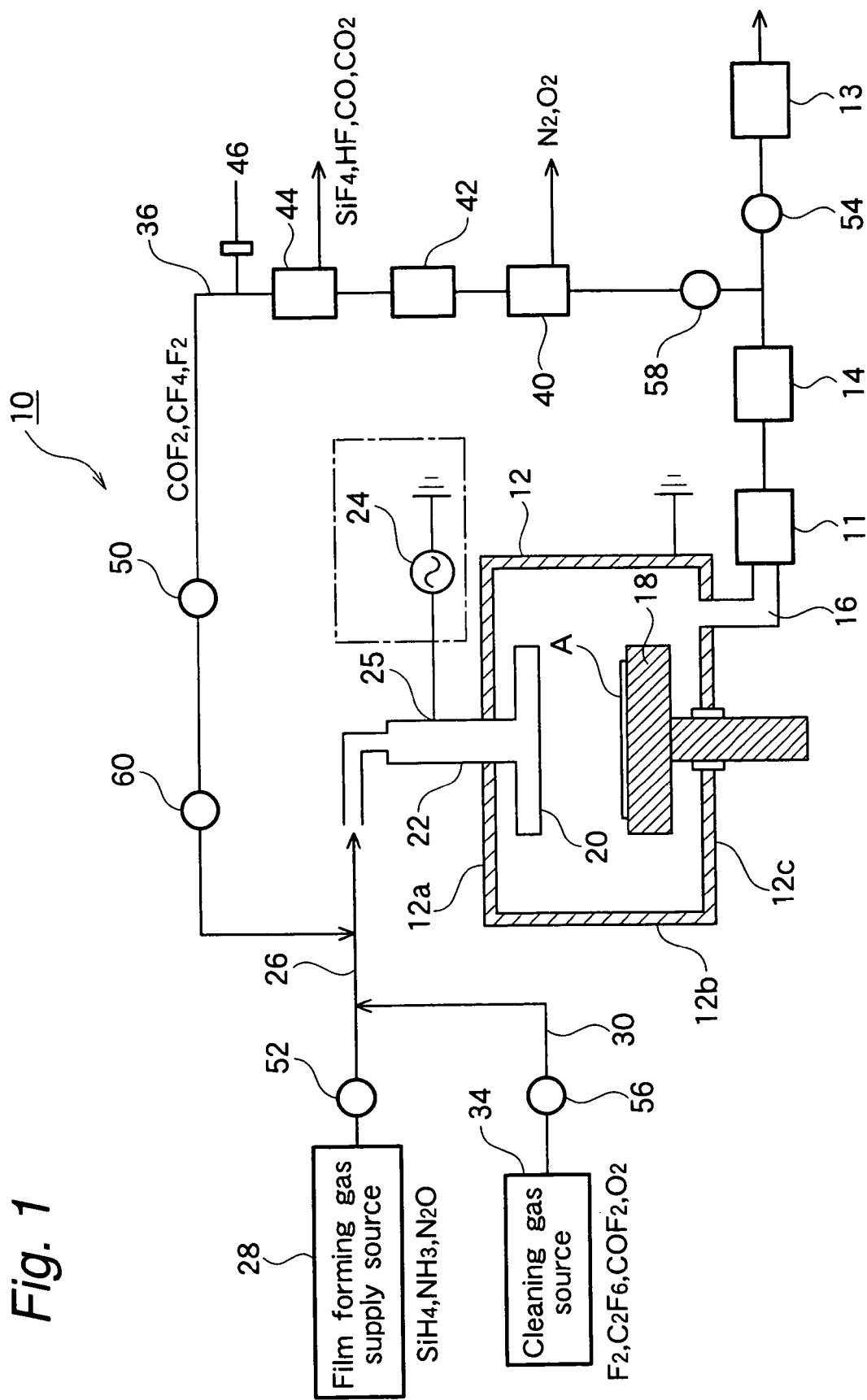
FIG. 1 is a schematic view showing a first embodiment of a CVD apparatus according to the present invention.

FIG. 1 is a schematic view showing a first embodiment of a CVD apparatus according to the present invention.

As shown in FIG. 1, a plasma CVD apparatus 10 to be used for a plasma CVD method comprises a reaction chamber 12 maintained in a decompression state (a vacuum state). Furthermore, the plasma CVD apparatus 10 is maintained in a constant vacuum state (a decompression state) by discharging an internal gas to the outside through an exhaust path 16 formed on a bottom wall 12c of the reaction chamber 12, by means of a mechanical booster pump 11, a dry pump 14 and a toxicity removing device 13 for causing an exhaust gas to be nontoxic.

Moreover, a lower electrode 18 constituting a stage for mounting a base material A to deposit (vapor deposit) a silicon thin film on a surface of a silicon wafer or the like, for example, is provided in the reaction chamber 12. The lower electrode 18 penetrates through the bottom wall 12c of the reaction chamber 12 and is constituted vertically slidably by a driving mechanism which is not shown, and a position can be adjusted. A sliding portion between the lower electrode 18 and the bottom wall 12c is provided with a seal member such as a seal ring which is not shown, in order to maintain a degree of vacuum in the reaction chamber 12.

On the other hand, an upper electrode 20 is provided in the upper part of the reaction chamber 12, and has a base end portion 22 thereof which penetrates through a top wall 12a of the reaction chamber 12 and is connected to a high frequency power source 24 provided on the outside of the reaction chamber 12. The upper electrode 20 is provided with a high frequency applicator 25 such as a high frequency application coil which is not shown. In addition, a matching circuit (not shown) is provided between the high frequency applicator 25 and the high frequency power source 24. Consequently, it is possible to propagate a high frequency generated by the high frequency power source 24 to the high frequency applicator 25 such as the high frequency application coil without a loss.

Moreover, a reactive gas supply path 26 is formed on the upper electrode 20, and a film forming gas is introduced from a film forming gas supply source 28 into the reaction chamber 12 maintained in a decompression state, through the reactive gas supply path 26 and the upper electrode 20.

On the other hand, a cleaning gas supply path 30 is branched and connected to the reactive gas supply path 26. As a result, a cleaning gas can be introduced from a cleaning gas source 34 into the reaction chamber 12 through the cleaning gas supply path 30.

Moreover, there is provided an exhaust gas recycling path 36 which is branched from the downstream side of the dry pump 14 in the exhaust path 16 and is reached to the reactive gas supply path 26 and is served to recycle the exhaust gas to be recycled to the reaction chamber 12. The exhaust gas recycling path 36 serves to recycle the exhaust gas of the cleaning gas introduced into the reaction chamber 12 in cleaning which will be described below.

By such a structure, if a pressure is too low on the suction side of the dry pump 14 and the exhaust gas recycling path is provided, a pressure rising pump is required. On the other hand, thus, the exhaust gas recycling path 36 branched from the downstream side of the dry pump 14 in the exhaust path 16 is provided so that a pressure is raised. Therefore, it is possible to provide a filter to remove particles, or the like. Consequently, the generation of the particles is eliminated and the clogging of the filter is not caused, and the particles can be prevented from being recycled into the reaction chamber. Thus, a cleaning effect can be enhanced.

The exhaust gas recycling path 36 is provided with a polymer film device 40 for absorbing and removing an inactive gas such as $N_2$ or $O_2$ in the exhaust gas. Such a polymer film device 40 is not particularly restricted but can use a polymer film such as polysulfone or a hollow fiber film.

It is possible to provide, on the downstream of the polymer film device 40, a separator 44 through a compressor 42 for raising a pressure to 0.01 to 0.5 MPa, for example, if necessary. By way of example, it is also possible to propose that an unnecessary exhaust gas component such as $SiF_4$, HF, CO or $CO_2$ is selectively removed by the separator 44.

Furthermore, a gas analyzing sensor 46 is provided on the exhaust gas recycling path 36. Consequently, the component of the exhaust gas in the exhaust gas recycling path 36 which is recycled into the reaction chamber 12 is detected. Then, the amounts of the cleaning gas to be introduced into the polymer film device 40, the separator 44 and the reaction chamber 12 are controlled by a control device which is not shown. Thus, the gas component is caused to be constant. For example, the concentration of $COF_2$ is monitored to bring the cleaning gas component in the reaction chamber 12 into a constant stationary state.

Moreover, a safety valve 50 constituting a pressure releasing device is formed in the exhaust gas recycling path 36. This safety valve 50 has such a structure that a pressure is released by the control of the control device (not shown) when the exhaust gas recycling path 36 has a certain pressure of 0.5 MPa or more, for example. The safety valve 50 may be constituted by a relief valve for automatically opening when a certain pressure is obtained without depending on the control of the control device.

In the drawing, 52, 54, 56, 58 and 60 denote a switching valve.

The CVD apparatus 10 according to the present invention having such a structure is operated in the following manner.

First of all, the base material A for depositing a silicon thin film on a surface of a silicon wafer or the like, for example, is mounted over the stage of the lower electrode 18 in the reaction chamber 12. Thereafter, a distance between the base material A and the upper electrode 20 is regulated to be a predetermined distance by a driving mechanism which is not shown.

An internal gas is discharged to the outside through the exhaust path 16 formed on the bottom wall 12c in the reaction chamber 12, by means of the dry pump 14. Consequently, a constant vacuum state (a decompression state), for example, a decompression state of 10 to 2000 Pa is maintained.

The switching valve 52 provided on the reactive gas supply path 26 is opened and a film forming gas is introduced from the film forming gas supply source 28 into the reaction chamber 12, which is maintained in the decompression state, through the reactive gas supply path 26 and the upper electrode 20.

At this time, the switching valve 52 provided on the reactive gas supply path 26 and the switching valve 54 provided on the exhaust path 16 are opened. On the other hand, the switching valve 56 provided on the cleaning gas supply path 30 and the switching valves 58 and 60 provided on the exhaust gas recycling path 36 are closed.

In this case, it is preferable that monosilane ($SiH_4$), $N_2O$, $N_2$, $O_2$, Ar and the like in the formation of the film of silicon oxide ($SiO_2$) and the monosilane ($SiH_4$), $NH_3$, $N_2$, $O_2$ and Ar in the formation of the film of silicon nitride ($Si_3N_4$ or the like) should be supplied as the film forming gas which is to be fed from the film forming gas supply source 28, for example. However, the film forming gas is not restricted to them but they can properly be changed, for example, disilane ($Si_2H_6$), TEOS (tetraethoxysilane; $Si(OC_2H_5)_4$) or the like is used as the film forming gas and $O_2$, $O_3$ or the like is used as a carrier gas depending on the type of a thin film to be formed, for example.

A high frequency electric field is generated from the high frequency applicator 25 such as a high frequency application coil to the upper electrode 20 by a high frequency generated from the high frequency power source 24. Then, electrons are impacted with neutral molecules of the film forming gas in the electric field. As a result, a high frequency plasma is formed and the film forming gas is dissociated into ions and radicals. By the actions of the ions and radicals, a silicon thin film is formed on the surface of the base material A such as a silicon wafer which is provided on the lower electrode 18.

In such a CVD apparatus 10, at a film forming step, a thin film material such as $SiO_2$ or $Si_3N_4$ is also adhered to and deposited on the surfaces of an inner wall, an electrode and the like in the reaction chamber 12 other than a semiconductor product A to be formed. As a result, a by-product is formed by a discharge in the reaction chamber 12. When this by-product grows to have a constant thickness, it is peeled and scattered by a dead weight, a stress or the like. At the film forming step, consequently, fine particles to be foreign matters are mixed into the semiconductor product so that contamination is caused. For this reason, a thin film of high quality cannot be manufactured so that the disconnection or short-circuit of a semiconductor circuit is caused. In addition, there is a possibility that a yield or the like might also be deteriorated.

In the CVD apparatus 10 according to the present invention, therefore, a fluorinated cleaning gas containing a fluorocompound, that is, a cleaning gas supplied from the cleaning gas source 34 is introduced into the reaction chamber 12 through the cleaning gas supply path 30.

More specifically, after the thin film processing is ended as described above, the switching valve 52 provided on the reactive gas supply path 26 is closed to stop the supply of the film forming gas from the film forming gas supply source 28 into the reaction chamber 12.

Then, the switching valve 56 provided on the cleaning gas supply path 30 is opened to introduce the cleaning gas from the cleaning gas source 34 into the reaction chamber 12 through the cleaning gas supply path 30.

The high frequency is generated from the high frequency power source 24 and, thereafter, a high frequency electric field is generated from the high frequency applicator 25 such as a high frequency application coil to the upper electrode 20 so that a high frequency plasma is formed. As a result, the cleaning gas is dissociated into ions and radicals, and the ions and the radicals react to a by-product such as $SiO_2$ or $Si_3N_4$ which is adhered to and deposited on the surfaces of the inner wall, the electrode and the like in the reaction chamber 12 so that the by-product is changed into a gas as $SiF_4$.

In this case, the switching valve 54 provided on the exhaust path 16 is closed and the switching valves 58 and 60 provided on the exhaust gas recycling path 36 are opened so that the exhaust gas recycling path 36 is opened. In this case, the switching valve 54 does not need to be maintained in a full closing state but a part may flow to the toxicity removing device 13 in the exhaust path 16.

Consequently, the exhaust gas obtained after the execution of the cleaning process in the reaction chamber 12 flows through the exhaust gas recycling path 36, reaches the reactive gas supply path 26, and is recycled to the reaction chamber 12.

For example, the exhaust gas obtained after the execution of the cleaning process in the reaction chamber 12 contains a gas component such as $COF_2$, $CF_4$, $C_2F_6$, $F_2$, $SiF_4$, CO, $CO_2$, HF, $N_2$ or $O_2$.

The exhaust gas flowing through the exhaust gas recycling path 36 absorbs and removes an inactive gas such as $N_2$ or $O_2$ in the exhaust gas by the polymer film device 40. The inactive gas thus absorbed and removed by the polymer film device 40 can also be recovered and recycled through a recovery path which is not shown separately.

The pressure of the exhaust gas, from which the inactive gas in the exhaust gas is removed by the polymer film device 40, is raised through the compressor 42 if necessary. Thereafter, the exhaust gas is introduced into the separator 44 when the separator 44 is required. In this case, it is desirable that the pressure should be raised to 0.01 to 0.5 MPa by the compressor 42 in order to prevent the clogging of the separator 44 and the generation of particles.

In the case in which the separator 44 is thus provided, the unnecessary exhaust gas component such as $SiF_4$, HF, CO or $CO_2$ can selectively be removed from the exhaust gas. In this case, although not shown, the unnecessary exhaust gas component removed through the separator 44 may be properly discarded through the toxicity removing device for making non-toxicity or may be appropriately separated and recycled.

Accordingly, the exhaust gas which passes through the separator 44 and reaches to the reactive gas supply path 26, and is recycled to the reaction chamber 12, contains, as a cleaning gas component, a cleaning gas component such as $COF_2$, $CF_4$, $C_2F_6$ or $F_2$ or a concentrated gas component, and the cleaning can be carried out. Therefore, a gas utilization efficiency can be enhanced. In this case, the gas utilization efficiency implies a ratio (%) indicating that the supplied cleaning gas is replaced by a recycle gas.

In this case, moreover, the gas analyzing sensor 46 is provided on the exhaust gas recycling path 36 as described above. Consequently, the component of the exhaust gas in the exhaust gas recycling path 36, which is recycled in the reaction chamber 12, is detected and the amounts of the cleaning gas to be introduced into the polymer film device 40, the separator 44 and the reaction chamber 12 are controlled by the control device. Consequently, the gas component is caused to be constant.

More specifically, for example, the concentration of $COF_2$ is monitored to bring the cleaning gas component in the reaction chamber 12 into a constant stationary state. Thus, it is possible to execute uniform and efficient cleaning.

In such a stationary state, it is preferable that the concentration of $COF_2$ should be set within a range of 50% or more, and preferably 70 to 80%, for example, in consideration of the gas utilization efficiency.

As described above, moreover, the safety valve 50 constituting the pressure releasing device is constituted in the exhaust gas recycling path 36, and the exhaust gas recycling path 36 is constituted to release a pressure by the control of the control device when a certain pressure or more is obtained.

By such a structure, the pressure is released by the pressure releasing device when a certain pressure or more is obtained in the exhaust gas recycling path 36. Consequently, it is possible to prevent a rise in the pressure of the exhaust gas recycling path 36 which breaks or damages apparatuses such as the piping of the exhaust gas recycling path 36, the pump, the polymer film device and the separator. The safety valve 50 is controlled to be operated also when the pressure of the exhaust gas staying in the exhaust gas recycling path 36 is raised at the film forming step as described above.

Thus, the cleaning process is carried out while the exhaust gas is recycled into the reaction chamber 12 through the exhaust gas recycling path 36.

After the cleaning process is ended, then, the switching valve 56 provided on the cleaning gas supply path 30 is closed to stop the supply of the cleaning gas from the cleaning gas source 34.

Moreover, the switching valves 58 and 60 provided on the exhaust gas recycling path 36 are closed and the exhaust gas recycling path 36 is thus closed. Then, the switching valve 54 provided on the exhaust path 16 is opened and the switching valve 52 provided on the reactive gas supply path 26 is opened so that the supply of the film forming gas from the film forming gas supply source 28 into the reaction chamber 12 is started. As a result, a film forming process cycle is again started.

In this case, a control may be carried out by the control device in such a manner that the reactive gas supply path 26 and the exhaust gas recycling path 36 are opened in the initial stage of the cleaning during the cleaning, and the reactive gas supply path is closed to carry out the cleaning after the cleaning proceeds.

By such a structure, for example, $C_2F_6$ to be the cleaning gas is caused to flow for a constant time and $COF_2$ is then generated. Therefore, it is possible to use the $COF_2$ as the cleaning gas by recycling the $COF_2$ through the exhaust gas recycling path. Consequently, the utilization efficiency of the cleaning gas can be enhanced and a cost can also be reduced.

In this case, a fluorinated cleaning gas containing a fluorocompound to be used for a cleaning process includes perfluorocarbons having the number of carbon atoms of 1 to 6, for example:

chain aliphatic perfluorocarbons such as $CF_4$, $C_2F_6$, $C_3F_8$, $C_4F_{10}$ and $C_5F_{12}$;

alicyclic perfluorocarbons such as $C_4F_8$, $C_5F_{10}$ and $C_6F_{12}$;

linear perfluoroethers such as $CF_3OCF_3$, $CF_3OC_2F_5$ and $C_2F_5OC_2F_5$;

cyclic perfluoroethers such as $C_3F_6O$, $C_4F_8O$ and $C_5F_{10}O$;

unsaturated perfluorocarbons such as $C_3F_6$, $C_4F_8$ and $C_5F_8$; and diene perfluorocarbons such as $C_4F_6$ and $C_5F_8$.

Moreover, it is also possible to use perfluorocarbons containing oxygen such as $COF_2$, $CF_3COF$ or $CF_3OF$, fluorocompounds containing nitrogen such as $NF_3$, FNO, $F_3NO$ or $FNO_2$, and preferably, a fluorocompound containing oxygen and nitrogen.

These fluorocompounds may contain at least one fluorine atom having a part thereof replaced with a hydrogen atom.

It is preferable to use $CF_4$, $C_2F_6$ and $C_3F_8$ and more preferable to use $CF_4$ and $C_2F_6$.

These fluorocompounds can be used singly or in combination.

Moreover, the cleaning gas containing the fluorocompound used in the present invention can be utilized by properly mixing another gas within such a range that the advantage of the present invention is not damaged. Examples of another gas include He, Ne, Ar, $O_2$ and the like. The amount of blending of the gas is not particularly restricted but can be determined corresponding to the amount and thickness of a by-product (an adherend) adhered to the inner wall of the reaction chamber 12 in the CVD apparatus 10 or the like, the type of the fluorocompound to be used, the composition of the by-product and the like.

In addition, it is possible to utilize a fluorine gas ($F_2$) as a cleaning gas to be used for the cleaning process in addition to the fluorinated cleaning gases containing the fluorocompounds described above.

More specifically, a proper amount of additive gas such as oxygen or argon is usually mixed with the cleaning gas and is thus used in plasma cleaning.

In a mixed gas type of the cleaning gas and the additive gas, an etching speed tends to be increased when a content concentration of the cleaning gas is increased on condition that a total gas flow is constant. If the cleaning gas exceeds a constant concentration, however, there is a problem in that the generation of a plasma becomes unstable and an etching speed slows down and is deteriorated, and a cleaning uniformity is deteriorated. In particular, if the cleaning gas is used in a concentration of 100%, there is a problem in that the instability of the generation of the plasma, the slow-down and deterioration of the etching speed, and the deterioration in the cleaning uniformity tend to be more remarkable, and practical use is incomplete.

For this reason, it is necessary to carry out, for use, a dilution in order to reduce the concentration of a cleaning gas down to the concentration of a peak of an etching speed—cleaning gas concentration curve or to a low concentration which is equal to or less than them. A chamber pressure in the cleaning is raised or a gas flow is increased in order to suppress a reduction in the etching speed with the dilution, thereby optimizing the cleaning conditions. If the chamber pressure in the cleaning is raised or the gas flow is increased, however, the generation of the plasma is not stabilized so that the cleaning uniformity is damaged and the cleaning cannot be efficiently carried out.

On the other hand, by using, as the cleaning gas, a fluorine gas or a mixed gas of the fluorine gas and a gas which does not substantially react to fluorine in a plasma, it is possible to carry out a plasma processing. Consequently, an extremely excellent etching speed can be obtained. In addition, the plasma can be stably generated and an excellent cleaning uniformity can be maintained on condition that a total gas flow is approximately 1000 sccm and a chamber pressure is approximately 400 Pa.

If such a fluorine gas is used, moreover, an exhaust gas obtained after the cleaning process in the reaction chamber 12 contains HF, $SiF_4$ and the like in addition to unreacted $F_2$. Even if the separator 44 is not operated, accordingly, it is possible to utilize the exhaust gas as the cleaning gas again by simply operating the polymer film device 40 to absorb and remove an inactive gas such as $N_2$ or $O_2$ which is contained in the exhaust gas of the exhaust gas recycling path 36, for example. Therefore, it is possible to execute cleaning which is more uniform and efficient.

In this case, the switching valve 54 is not fully closed but causes apart of the exhaust gas to flow toward the toxicity removing device 13 in the exhaust path 16, thereby controlling the excessive storage of HF and $SiF_4$.

It is desirable that a fluorine gas to be used as the cleaning gas should be a fluorine gas of 100% by volume and should generate a plasma by a discharge.

Moreover, the gas for the cleaning may be constituted by a fluorine gas generating a plasma by a discharge and a gas which does not substantially react to fluorine in the plasma.

In this case, it is preferable that the concentration of the fluorine gas generating a plasma by a discharge should be set within a range of 20% by volume to 100% by volume and the concentration of a gas which does not substantially react to fluorine in the plasma should be set within a range of 0% by volume to 80% by volume (a fluorine gas generating a plasma by a discharge+a gas which does not substantially react to fluorine=100% by volume).

In addition, it is more preferable that the concentration of the fluorine gas generating the plasma by the discharge should be set within a range of 30% by volume to 100% by volume and the concentration of a gas which does not substantially react to fluorine in the plasma should be set within a range of 0% by volume to 70% by volume (a fluorine gas generating a plasma by a discharge+a gas which does not substantially react to fluorine=100% by volume).

Furthermore, it is preferable that a gas which does not substantially react to fluorine in a plasma should be at least one selected from a group including nitrogen, oxygen, carbon dioxide, $N_2O$, dry air, argon, helium and neon.

In this case, the "fluorine" in the gas which does not substantially react to fluorine includes a fluorine molecule, a fluorine atom, a fluorine radical, a fluorine ion and the like.

Examples of the desired compound for chamber cleaning based on the fluorocompound include an adherend comprising a silicon compound which is adhered to a CVD chamber wall, a jig of a CVD apparatus and the like by a CVD method or the like. Examples of the adherend of such a silicon compound include at least one of:

(1) a compound comprising silicon, (2) a compound comprising at least one of oxygen, nitrogen, fluorine and carbon, and silicon, or (3) a compound comprising a high-melting-point metal silicide. More specifically, for example, it is possible to use a high-melting-point metal silicide such as Si, $SiO_2$, $Si_3N_4$ or WSi.

Moreover, it is desirable that the flow of the cleaning gas to be introduced into the reaction chamber 12 should be 0.1 to 10 L/min and preferably 0.5 to 1 L/min in consideration of the effect obtained by cleaning a by-product adhered to the inner wall of the chamber 12. More specifically, if the flow of the cleaning gas to be introduced into the reaction chamber 12 is less than 0.1 L/min, the cleaning effect cannot be expected. To the contrary, if the flow of the introduction is more than 10 L/min, the amount of the cleaning gas to be discharged to the outside without contributing to the cleaning is increased.

The flow of the introduction can be properly changed depending on the type, size or the like of the base material A, for example, a flat panel disc. As an example, it is preferable that the flow of the introduction should be set to be 0.5 to 5 L/min if the fluorocompound is $C_2F_6$.

In consideration of the effect obtained by cleaning the by-product adhered to the inner wall of the chamber 12, furthermore, it is desirable that the pressure of the cleaning gas in the reaction chamber 12 should be 10 to 2000 Pa and preferably 50 to 500 Pa. More specifically, if the pressure of the cleaning gas in the reaction chamber 12 is smaller than 10 Pa or is more than 2000 Pa, the cleaning effect cannot be expected. The pressure in the reaction chamber 12 can be properly changed depending on the type, size or the like of the base material A, for example, a flat panel disc. As an example, it is preferable that the pressure should be 100 to 500 Pa if the fluorocompound is $C_2F_6$.

Figure 2:
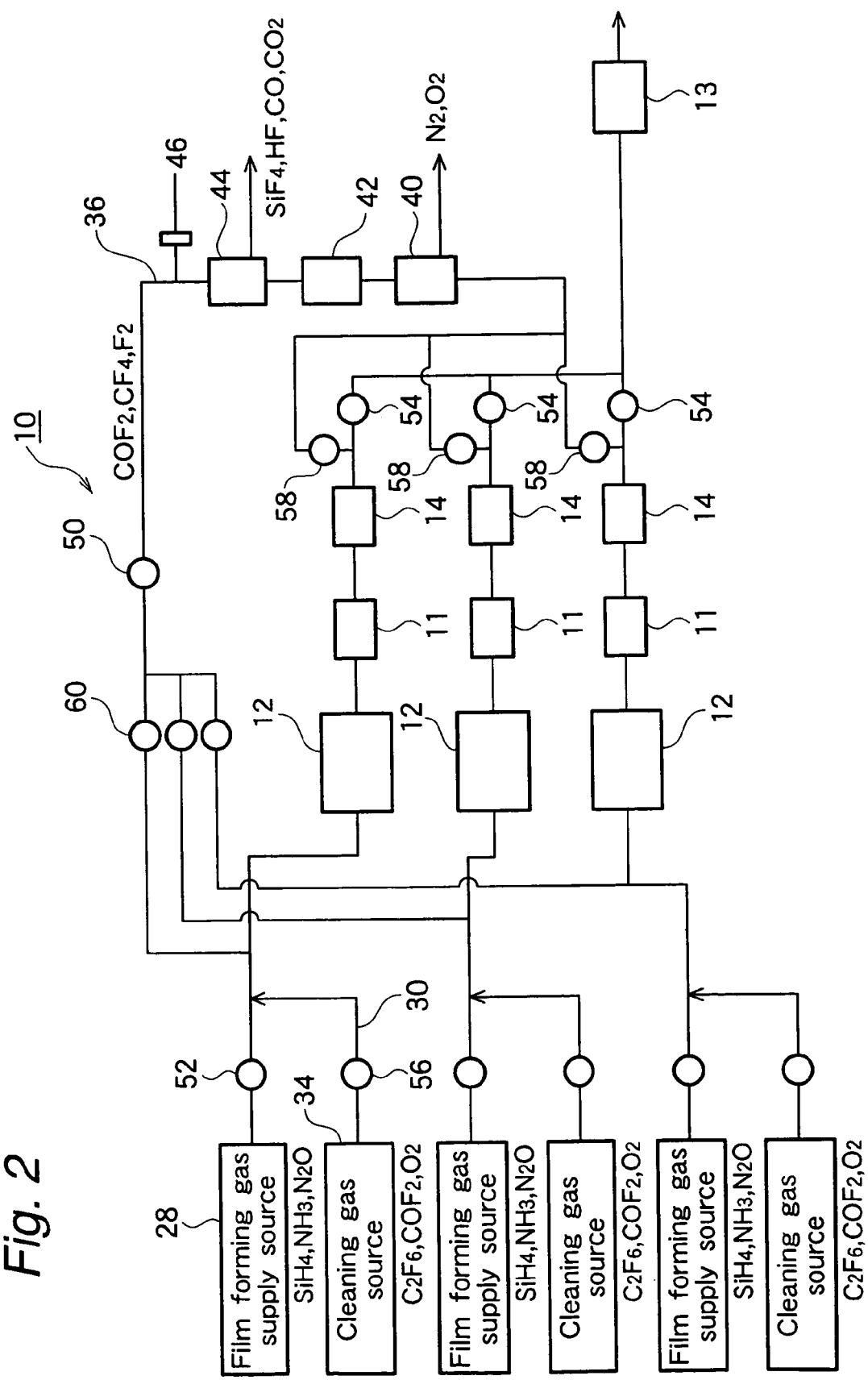
FIG. 2 is a schematic view showing a second embodiment of a CVD apparatus according to the present invention.

FIG. 2 is a schematic view showing a second embodiment of the CVD apparatus 10 according to the present invention.

The CVD apparatus 10 according to the present embodiment has basically the same structure as that of the CVD apparatus 10 shown in FIG. 1, and the same components have the same reference numerals and detailed description thereof will be omitted.

While the reaction chamber 12 is set to be a single reaction chamber in the CVD apparatus 10 according to the embodiment in FIG. 1, the CVD apparatus 10 according to the present embodiment is of a so-called multichamber type in which a plurality of reaction chambers 12 are connected in parallel as shown in FIG. 2. Consequently, a film forming efficiency and a gas utilization efficiency can be more enhanced.

Figure 3:
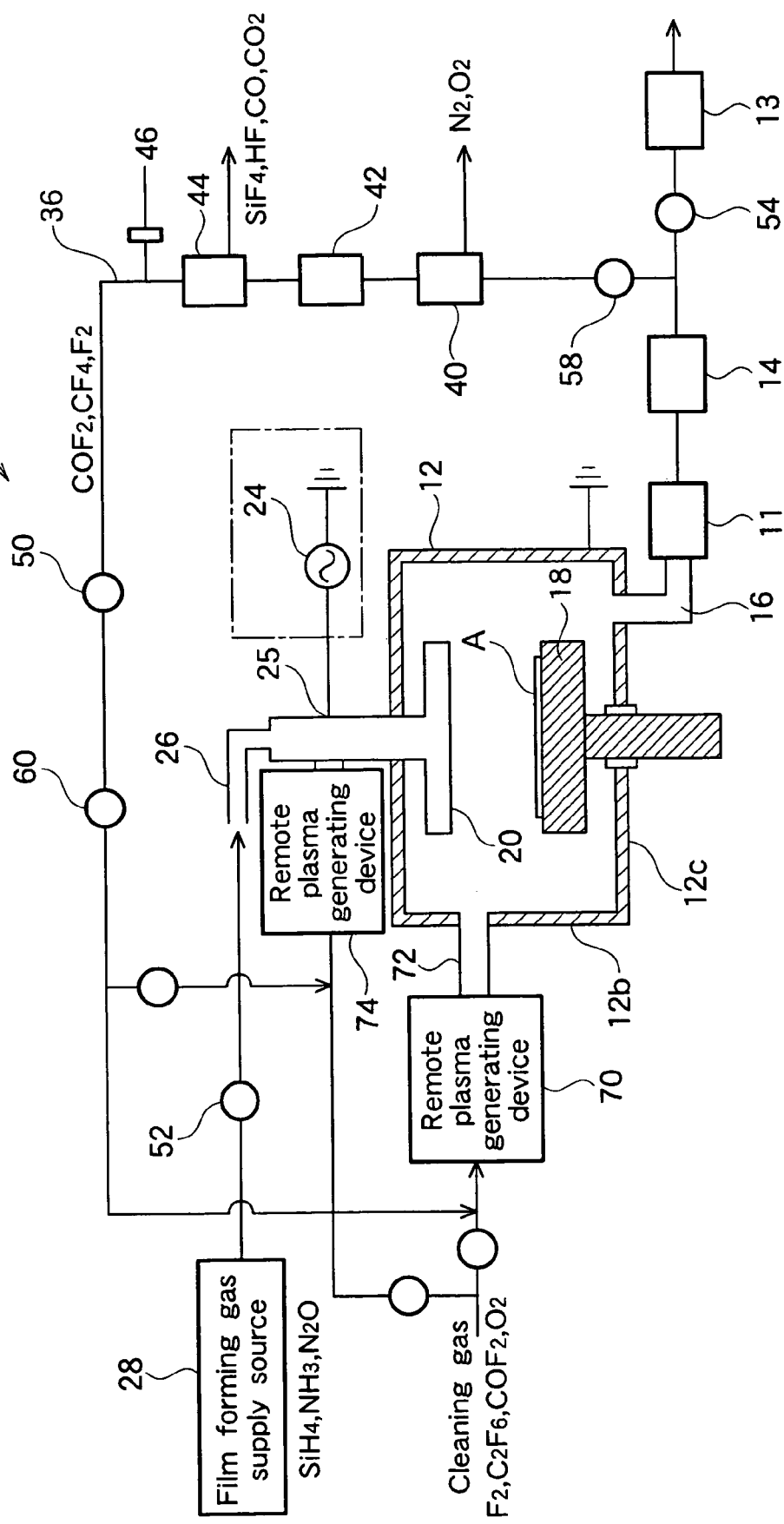
FIG. 3 is a schematic view showing a third embodiment of a CVD apparatus according to the present invention.
Figure 4:
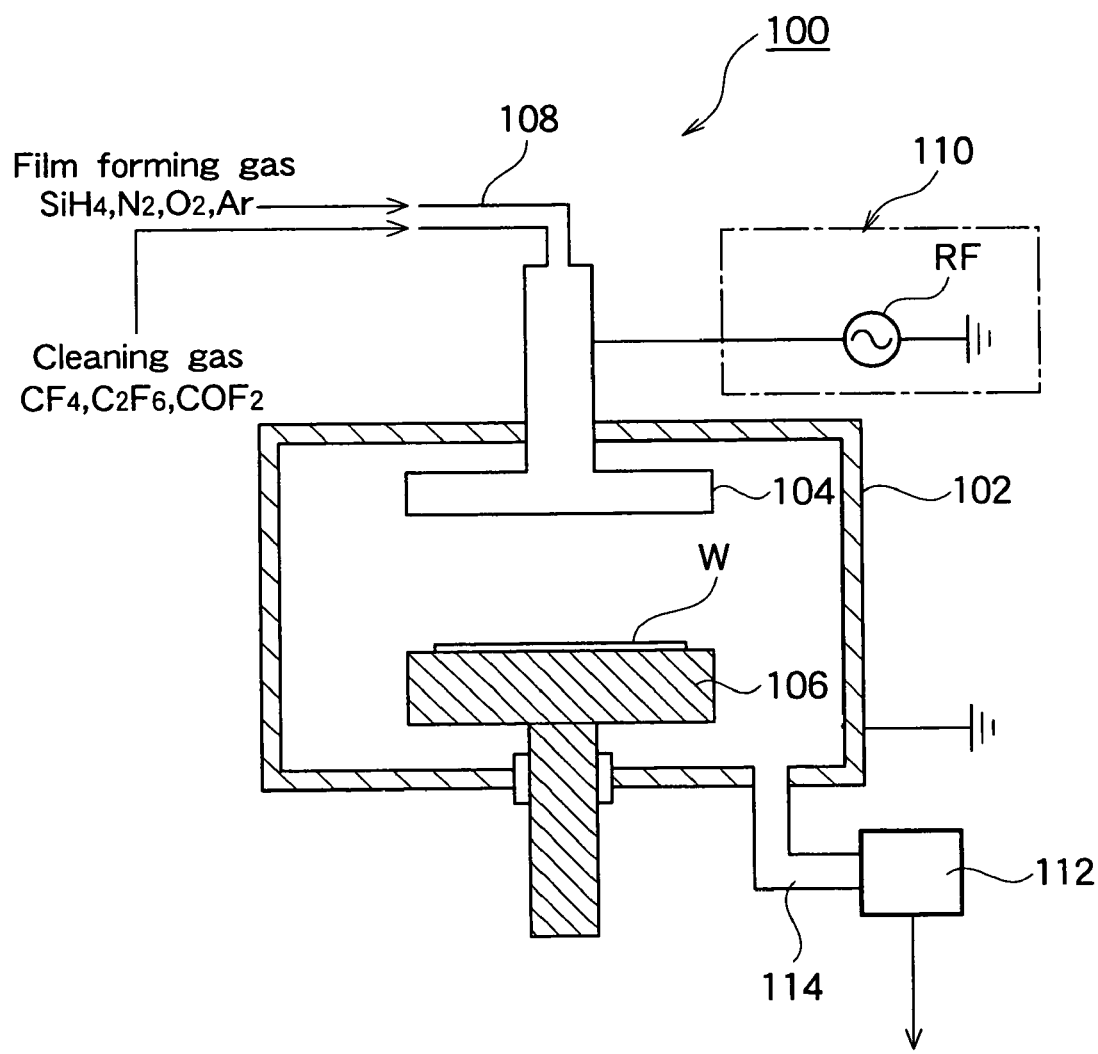
FIG. 4 is a schematic view showing a plasma CVD apparatus to be used for a conventional plasma CVD method.

FIG. 3 is a schematic view showing a third embodiment of the CVD apparatus 10 according to the present invention.

The CVD apparatus 10 according to the present embodiment has basically the same structure as that of the CVD apparatus 10 shown in FIG. 1, and the same components have the same reference numerals and detailed description thereof will be omitted.

The CVD apparatus 10 according to the embodiment in FIG. 1 is constituted to introduce the cleaning gas supplied from the cleaning gas source 34 into the reaction chamber 12 through the cleaning gas supply path 30. On the contrary, a fluorinated cleaning gas containing a fluorocompound is converted to a plasma by a remote plasma generating device 70 and the plasma is introduced from a side wall 12b of the reaction chamber 12 maintained in a decompression state into the reaction chamber 12 through a connecting piping 72 in the CVD apparatus 10 according to the present embodiment as shown in FIG. 3.

In this case, the material of the connecting piping 72 is not particularly restricted but it is desirable to use alumina, inactivated aluminum, a fluororesin, a metal coated with a fluororesin and the like, for example, in consideration of the effect of preventing the reduction in a gasification efficiency.

The remote plasma generating device 70 and the reaction chamber 12 are so arranged that a cleaning gas converted to a plasma is introduced from the chamber side wall 12b through the connecting piping 72 in the present embodiment. However, it is not restricted but it is sufficient that the cleaning gas is directly introduced into the reaction chamber 12. More specifically, the cleaning gas may be introduced from the top wall 12a and the bottom wall 12c in the chamber 12, for example.

As shown in FIG. 3, furthermore, the cleaning gas can be passed through a remote plasma generating device 74 and the cleaning gas converted to a plasma can also be introduced into the reaction chamber 12 through the shower head of the upper electrode 20 in the upper part of the reaction chamber 12.

As shown in FIG. 3, it is desirable that the cleaning gas recycled by the exhaust gas recycling path 36 should be returned to the forward part of the remote plasma generating device 70 or the remote plasma generating device 74 and the cleaning gas should be converted to a plasma by the remote plasma generating device 70 or the remote plasma generating device 74 and should be introduced into the reaction chamber 12 from the chamber side wall 12b of the reaction chamber 12 or through the shower head of the upper electrode 20 in the upper part of the reaction chamber 12.

In this case, in the initial stage of the cleaning during the cleaning, it is also possible to carry out a control by means of a control device so as to open a cleaning gas supply path (the connecting piping 72) from the remote plasma generating device 70 or 74, to open the exhaust gas recycling path 36 if necessary, and to close the cleaning gas supply path after the progress of the cleaning, thereby performing the cleaning.

By such a structure, after $C_2F_6$ to be the cleaning gas is caused to flow for a constant time, for example, $COF_2$ is generated. Therefore, the $COF_2$ is recycled through the exhaust gas recycling path and can be thus used as the cleaning gas. Consequently, the utilization efficiency of the cleaning gas can be enhanced and a cost can also be reduced.

Furthermore, a well-known remote plasma generating device is preferably used as the remote plasma generating device 70 and is not particularly restricted. For example, "ASTRON" (manufactured by ASTEX Co., Ltd.) can be used.

After a film forming process is thus carried out, the fluorinated cleaning gas containing a fluorocompound is converted to a plasma by the remote plasma generating device 70 and the cleaning gas thus converted to the plasma is introduced into the reaction chamber 12, and a by-product adhered into the reaction chamber 12 is removed. By such a structure, it is possible to enhance the dissociation efficiency of the cleaning gas and to efficiently remove a by-product such as $SiO_2$ or $Si_3N_4$ which is adhered to and deposited on the surfaces of an inner wall, an electrode and the like in the reaction chamber 12. In addition, the amount of the cleaning gas to be discharged is extremely small and the influence on an environment such as global warming is also lessened, and the cost can also be reduced.

While the examples of the cleaning device in the plasma CVD apparatus according to the present invention have been described above, the formation of a silicon thin film has been described in the above examples. Without departing from the scope of the present invention, for example, the examples can also be applied to the case in which a thin film such as another silicon germanium film (SiGe), a silicon carbide film (SiC), an SiOF film, an SiON film or a carbonaceous $SiO_2$ film is formed.

Although the horizontal apparatus has been described in the examples, moreover, it is also possible to use a vertical apparatus in place thereof. While the leaf type has been described in the examples, furthermore, the present invention can also be applied to a batch type CVD apparatus.

While the present invention has been applied to the plasma CVD apparatus in the examples, it is a matter of course that various changes can be made, that is, the present invention can also be applied to other CVD methods such as a vacuum deposition method in which a thin film material is deposited on a substrate by thermal decomposition, oxidation, reduction, polymerization, vaporization reaction or the like at a high temperature.

While the preferred examples of the present invention have been described above, the present invention is not restricted thereto but various changes-can be made without departing from the scope of the present invention.

Effect of the Invention

According to the present invention, the inner part of the reaction chamber is cleaned while the exhaust gas is recycled to the reaction chamber through the exhaust gas recycling path. Therefore, a cleaning gas component contained in the exhaust gas can be used again as a cleaning gas in the reaction chamber. Consequently, a gas utilization efficiency can be enhanced.

Accordingly, a by-product such as $SiO_2$ or $Si_3N_4$ adhered to and deposited on the inner part of the reaction chamber can be removed. In the film formation, therefore, the mixture of fine particles into a semiconductor product and contamination thereof can be eliminated, a thin film of high quality can be manufactured and a yield or the like can also be enhanced.

Moreover, the cleaning gas component discharged finally to the outside is very lessened. Therefore, the amount of the discharge of the cleaning gas is also very small and an influence on an environment such as global warming can also be lessened.

According to the present invention, furthermore, the exhaust gas is recycled from a downstream side of a dry pump to the reaction chamber. Therefore, a pressure is raised and it is possible to provide a filter for removing particles or the like. Consequently, the generation of the particles is eliminated and the clogging of the filter is not caused, and the particles are not recycled into the reaction chamber. Thus, a cleaning effect can be enhanced.

According to the present invention, moreover, an inactive gas such as $N_2$ or $O_2$ can be absorbed and removed by the polymer film device. Therefore, it is possible to carry out cleaning by recycling only the cleaning gas component into the reaction chamber. Consequently, a gas utilization efficiency can be enhanced. In addition, it is possible to recover and recycle the inactive gas thus absorbed and removed.

According to the present invention, furthermore, an unnecessary exhaust gas component such as $SiF_4$, HF, CO or $CO_2$ is selectively removed by the separator. For example, therefore, it is possible to carry out the cleaning by recycling a cleaning gas component such as $COF_2$, $CF_4$, $C_2F_6$ or $F_2$ or a concentrated gas component into the reaction chamber. Consequently, a gas utilization efficiency can be enhanced.

According to the present invention, moreover, the pressure of the exhaust gas, that is, the cleaning gas is raised by means of the compressor and the same gas is recycled into the reaction chamber. Therefore, it is possible to hold the pressure in the reaction chamber to be constant. Consequently, it is possible to maintain a cleaning effect to be constant.

According to the present invention, furthermore, the concentration of $COF_2$ flowing in the exhaust gas recycling path is monitored by the control device, for example. Consequently, the cleaning gas component in the reaction chamber can be maintained in a constant stationary state. Therefore, it is possible to execute uniform and efficient cleaning.

According to the present invention, moreover, the pressure is released by the pressure releasing device when the pressure of the exhaust gas recycling path is a constant pressure or more. Therefore, it is possible to prevent a rise in the pressure of the exhaust gas recycling path which causes the breakage and damage of apparatuses such as the piping of the exhaust gas recycling path, the pump, the polymer film device and the separator.

According to the present invention, furthermore, the exhaust gas recycling path is opened in the cleaning. Therefore, the inner part of the reaction chamber is cleaned while the exhaust gas is recycled into the reaction chamber through the exhaust gas recycling path. Consequently, it is possible to use the cleaning gas component contained in the exhaust gas as a cleaning gas in the reaction chamber again. Thus, the gas utilization efficiency can be enhanced.

On the other hand, when a deposited film is to be formed on the surface of a base material in the reaction chamber, the exhaust gas recycling path is closed. Consequently, it is possible to hold a film forming gas component to be constant. Thus, it is possible to form a uniform thin film of constant quality on the base material.

According to the present invention, furthermore, after the cleaning gas, for example, $C_2F_6$ is caused to flow for a constant time, $COF_2$ is generated. Therefore, the $COF_2$ is recycled through the exhaust gas recycling path and can be used as the cleaning gas. Thus, the utilization efficiency of the cleaning gas can be enhanced and a cost can also be reduced. Thus, the present invention is very excellent and can produce various remarkable and special functions and effects.

The invention claimed is:

1. A CVD apparatus for supplying a reactive gas into a reaction chamber and forming a deposited film on a surface of a base material provided in the reaction chamber, comprising:
   a dry pump;
   a toxicity removing device;
   an exhaust gas recycling path for recycling an exhaust gas reaching the reaction chamber, is provided on an exhaust path for exhausting a gas from an inner part of the reaction chamber through the dry pump and the toxicity removing device, the exhaust gas recycling path is branched from a downstream side of the dry pump to recycle exhaust gas from the downstream side of the dry pump and an upstream side of the toxicity removing device, to the reaction chamber;
   a polymer film device for absorbing and removing an inactive gas in an exhaust gas is provided on the exhaust gas recycling path, the polymer film device removes at least one of $N_2$ and $O_2$;
   a separator for selectively removing an unnecessary exhaust gas component is provided on the exhaust gas recycling path;
   a compressor for raising a pressure of an exhaust gas and recycling the exhaust gas to the reaction chamber is provided on the exhaust gas recycling path;
   a control device for detecting a component of the exhaust gas recycled into the reaction chamber and for causing the gas component to be constant is provided on the exhaust gas recycling path;
   a switching device for switching the exhaust gas recycling path and a reactive gas supply path; and
   the exhaust gas recycling path is provided with a pressure releasing device for releasing a pressure when the exhaust gas recycling path has a constant pressure or more, and
   the exhaust gas recycling path is opened when a cleaning gas is to be introduced into the reaction chamber through the reactive gas supply path to clean an inner part of the reaction chamber, and
   a switching control is carried out by the switching device to close the exhaust gas recycling path when a deposited film is to be formed on a surface of a base material in the reaction chamber,
   wherein the switching device is located upstream in the gas recycling path from the polymer film device, separator, compressor, control device and pressure releasing device, and
   wherein the reactive gas supply path and the exhaust gas recycling path are opened in an initial stage of the cleaning during the cleaning, and
   a switching control is carried out by the switching device in order to close the reactive gas supply path to carry out the cleaning after the cleaning progresses.

2. The CVD apparatus according to claim 1, further comprising a switching device for switching the exhaust gas recycling path and a reactive gas supply path,
   the exhaust gas recycling path being opened if necessary when a cleaning gas is to be introduced into the reaction chamber through a remote plasma generating device, thereby cleaning an inner part of the reaction chamber, and
   a switching control being carried out by a switching device in order to close the exhaust gas recycling path when a deposited film is to be formed on the surface of the base material in the reaction chamber.

3. The CVD apparatus according to claim 2, wherein a cleaning gas supply path from a remote plasma generating device is opened and the exhaust gas recycling path is opened if necessary in an initial stage of the cleaning during the cleaning, and a switching control is carried out by the switching device in order to close the cleaning gas supply path to carry out the cleaning after the cleaning progresses.

4. The CVD apparatus according to claim 1, wherein after a film forming process for a substrate is carried out by the CVD apparatus, a cleaning gas to be used for removing a by-product adhered into the reaction chamber, is a cleaning gas containing a fluorine gas.

5. The CVD apparatus according to claim 1, further comprising a recovery path provided on the exhaust gas recycling path to recover and recycle the inactive gas absorbed and removed by the polymer film device.

6. A CVD apparatus for supplying a reactive gas into a reaction chamber and forming a deposited film on a surface of a base material provided in the reaction chamber, comprising:

an exhaust gas recycling path for recycling an exhaust gas reaching the reaction chamber is provided on an exhaust path for exhausting a gas from an inner part of the reaction chamber through a pump;

a polymer film device for absorbing and removing an inactive gas in an exhaust gas is provided on the exhaust gas recycling path, wherein the polymer film device removes at least one of $N_2$, and $O_2$;

a switching device for switching the exhaust gas recycling path and a reactive gas supply path such that the exhaust gas recycling path is opened when a cleaning gas is to be introduced into the reaction chamber through the reactive gas supply path to clean an inner part of the reaction chamber, and a switching control is carried out by the switching device to close the exhaust gas recycling path when a deposited film is to be formed on a surface of a base material in the reaction chamber, and the reactive gas supply path and the exhaust gas recycling path are opened by respective switching devices in an initial stage of the cleaning during the cleaning, and a switching control is carried out by the switching device for the reactive gas supply path in order to close the reactive gas supply path to carry out the cleaning after the cleaning progresses.

* * * * *